United States Patent
Wagner

(10) Patent No.: US 10,101,604 B2
(45) Date of Patent: Oct. 16, 2018

(54) ADAPTABLE BEZEL ASSEMBLY FOR EXTREME SERVICE CONDITIONS

(71) Applicant: C-Marine Dynamics, Inc., Hampton, NH (US)

(72) Inventor: Charles J. Wagner, Stratham, NH (US)

(73) Assignee: C3I, INC., Exter, NH (US)

( * ) Notice: Subject to any disclaimer, the term of this patent is extended or adjusted under 35 U.S.C. 154(b) by 196 days.

(21) Appl. No.: 15/141,353

(22) Filed: Apr. 28, 2016

(65) Prior Publication Data

US 2016/0238877 A1    Aug. 18, 2016

Related U.S. Application Data

(63) Continuation-in-part of application No. 14/211,951, filed on Mar. 14, 2014.

(60) Provisional application No. 61/791,365, filed on Mar. 15, 2013.

(51) Int. Cl.
| | |
|---|---|
| G02F 1/1333 | (2006.01) |
| G02F 1/1335 | (2006.01) |
| H05K 5/00 | (2006.01) |
| H05K 9/00 | (2006.01) |
| F21V 8/00 | (2006.01) |

(52) U.S. Cl.
CPC .... *G02F 1/133308* (2013.01); *G02F 1/13338* (2013.01); *H05K 5/0017* (2013.01); *H05K 9/0054* (2013.01); *G02B 6/0068* (2013.01); *G02F 1/133385* (2013.01); *G02F 2001/133311* (2013.01); *G02F 2001/133328* (2013.01); *G02F 2001/133334* (2013.01)

(58) Field of Classification Search
CPC .................................................. G02F 1/133308
See application file for complete search history.

(56) References Cited

U.S. PATENT DOCUMENTS

| | | | |
|---|---|---|---|
| 2003/0117053 A1* | 6/2003 | Tajima | G02F 1/133308 313/292 |
| 2009/0284444 A1* | 11/2009 | Wilson | G06F 1/1603 345/32 |
| 2013/0107143 A1* | 5/2013 | Dighde | G02F 1/133308 349/1 |

* cited by examiner

Primary Examiner — Wen-Ying P Chen
(74) Attorney, Agent, or Firm — Sarita L. Pickett

(57) ABSTRACT

A display assembly includes front and rear bezel members each defining a frame around a display opening. The front bezel member is capable of secure attachment to the rear bezel member at an interface that defines at least one gap. A display panel is retained against the rear face of the rear bezel member. At least one additional panel member is retained in the gap between the front and rear bezel members, such as a touch panel or EMI panel. The display panel, EMI panel, and touch panel are each individually removable from the display assembly.

19 Claims, 11 Drawing Sheets

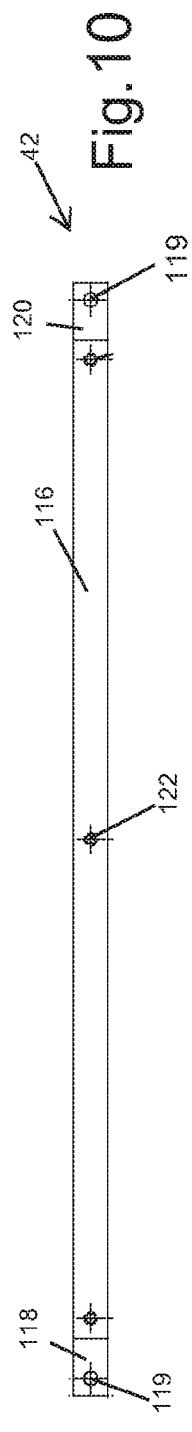
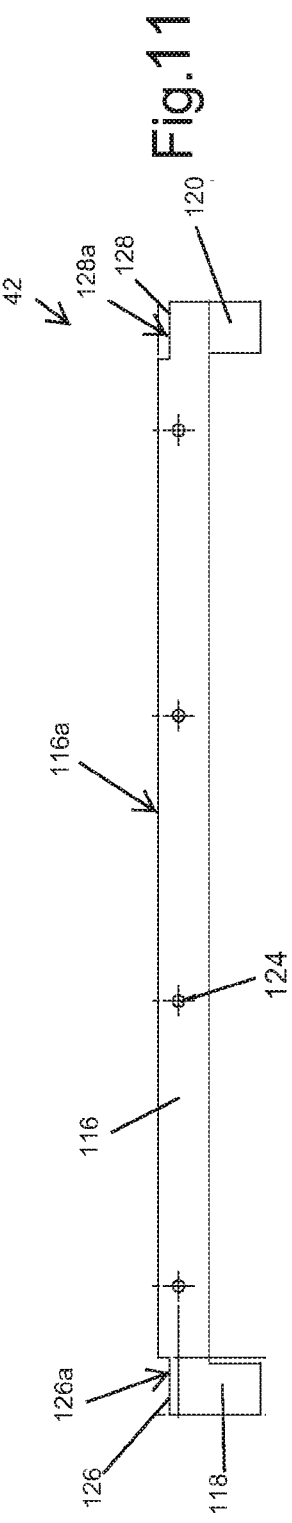
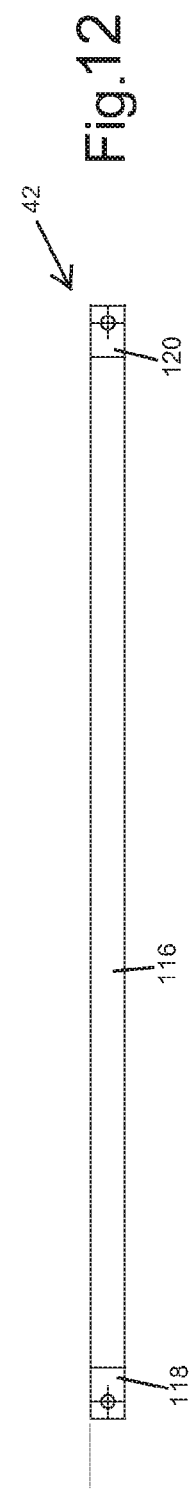

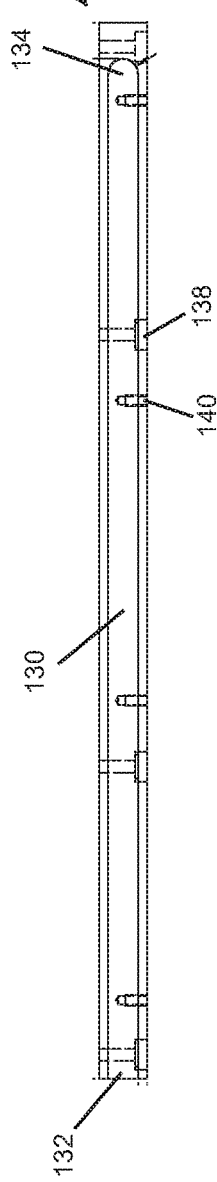
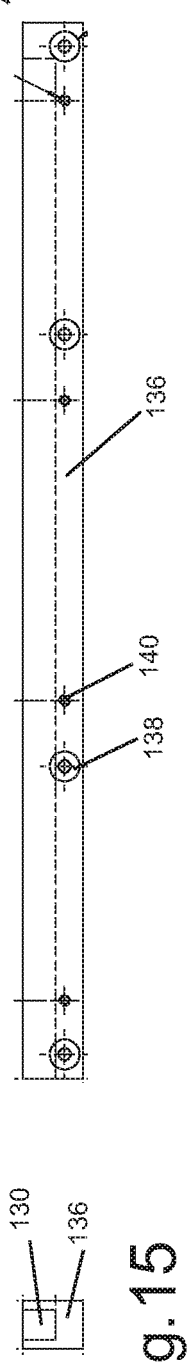
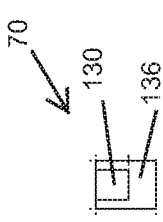

Figure 16
Figure 17
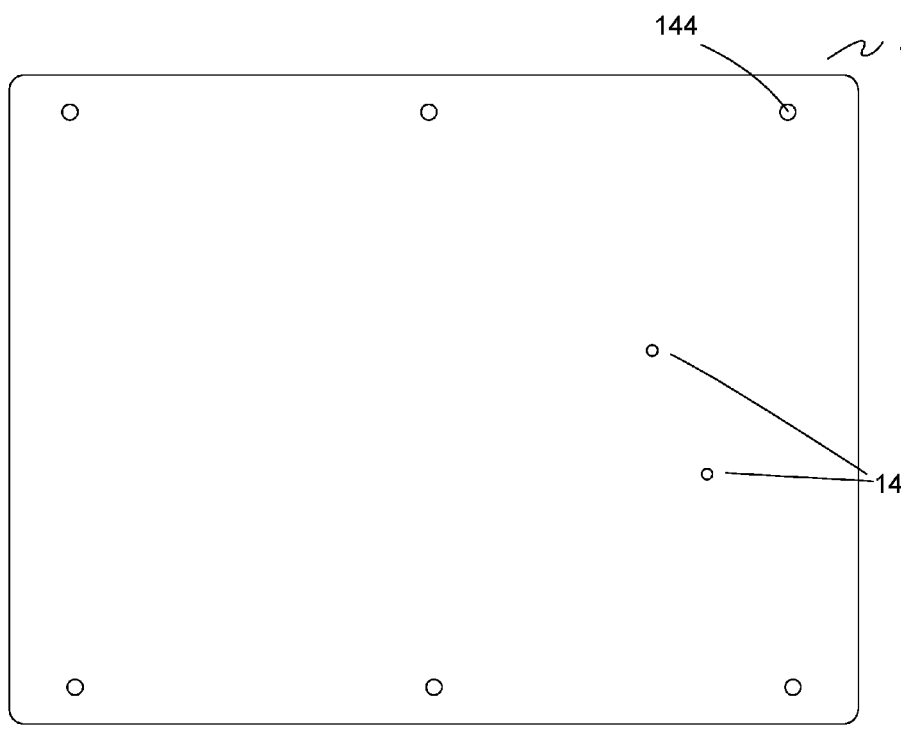
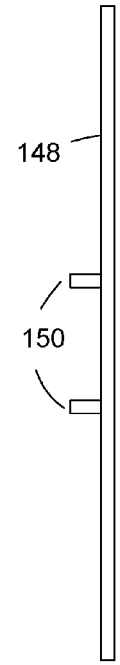

ADAPTABLE BEZEL ASSEMBLY FOR EXTREME SERVICE CONDITIONS

BACKGROUND OF THE INVENTION

1. Field of the Invention

The present invention relates generally to electronic display equipment and more particularly to a bezel for devices with display screens.

2. Description of the Prior Art

Display screens, such as liquid crystal displays (LCDs), touch panels, and Em-IO screens, are used in a wide variety of indoor and outdoor environments. Some extreme environments damage or render these displays inoperable due to high levels of shock, vibration, moisture or water, or electromagnetic interference.

Previous design approaches to meeting the requirements of such extreme service has been to laminate the various display hardware components—LCD panel, electromagnetic interference (EMI) panel, backlighting assembly, touch panel, etc.—into a single bonded package. An example of this design approach is an LCD display assembly having a laminated LCD display module mounted between a display bezel and display case, where components of the LCD display module are bonded together.

Electronics manufacturers traditionally buy laminated LCD display assemblies from a third-party manufacturer who specializes in making LCD display units. The electronics manufacturer will insert the laminated display assembly into a case as part of a permanent assembly. For durability, preventing movement between display components, and preventing parallax from improperly aligned display components, the manufacturer of the completed unit uses a laminated display assembly where all of the display components are firmly held together and sealed as a single unit. If any part of the display assembly becomes damaged or fails, the entire laminated assembly or the entire completed product is replaced.

SUMMARY OF THE INVENTION

A major disadvantage of the above-described approach to display bezels is that individual components of the resulting product are not serviceable or replaceable individually. That is, the failure of any one of the hardware components of laminated LCD display module requires replacement of the entire combined laminate package. For example, a cracked display panel or defective backlighting component cannot be replaced individually, but instead must be replaced by installing a new laminated LCD display module that includes additional components.

Another disadvantage is that display assemblies are not adaptable to a change in the requirements of any one component. For example, a change in the required dB level of the EMI screen requires the replacement of the entire laminated display module, not just replacement of the EMI screen. For the same reason, other damaged components require replacement of the entire laminated display module.

The need to replace the entire laminated display module is costly. Also, the above approach is inflexible to changes or improvements to the device components, particularly when a replacement component has a different dimension (e.g., thickness) than the component being replaced.

An additional limitation of conventional approaches is the difficulty in satisfying military specification MIL-S-901 D, such as Grade A shock tests for high impact mechanical shock to a subassembly or subsidiary component. Particularly when the display panel or EMI panel include glass, shock and vibration break these panels during shock tests, resulting in failure of the unit and inability to meet the Grade A shock requirements. Therefore, what is needed is an improved bezel architecture that is adaptable to component changes and suitable for use in extreme service environments.

The present invention overcomes these limitations by providing a bezel assembly that allows each item in the display assembly to be independently modified or replaced separately from other components. For example, a change in a dB requirement for an EMI screen can be met by disassembling the bezel assembly, removing the existing EMI screen, and replacing it with a different EMI screen that satisfies the new dB requirement. This service procedure may be independently performed for each component of the combined display product.

In one embodiment, a display assembly includes a front bezel member made of a rigid material and defining a first frame around a front display opening. The front bezel member has a front face and a rear face. A rear bezel member is made of a rigid material and defines a second frame around a rear display opening. The rear bezel member has a front face and a rear face. The rear bezel member is sized and constructed to be assembled with the front bezel member with the first frame aligned with the second frame and defining a gap between the first frame and the second frame. A display panel has a glass face with a display edge portion removably retained against the rear face of the rear bezel member and extending across the rear display opening. A panel edge portion of at least one panel member is removably disposed in the gap between the first frame and the second frame with the panel member(s) extending across the front display opening. The panel member(s) are an EMI panel and/or a touch panel. The display panel and each panel member are individually removable from the display assembly.

Another embodiment of a display assembly includes a front bezel member made of metal and defining a substantially rectangular first frame around a front display opening. A rear bezel member made of metal defines a second substantially rectangular second frame around a rear display opening. The first frame is sized and constructed to be assembled in alignment with the second frame and define at least one gap between the first frame and the second frame. An LCD display assembly has a glass display panel and a light distribution panel with an edge portion. The glass display panel is hard mounted to the rear surface of the rear bezel member. A light source is disposed adjacent the edge portion of the light distribution panel to backlight the LCD display assembly.

In some embodiments, hard mounting the LCD display assembly includes disposing a display panel gasket between the glass display panel and the rear surface of the rear bezel member, where the display panel gasket is made of an elastomer having a durometer of at least 45 A.

In some embodiments, a front cover is hinged to a front surface of the front bezel member and operable between a closed position and an open position.

In some embodiments, the light source is a plurality of LEDs disposed along the edge portion of the light distribution panel and positioned to emit light into the edge portion of the light distribution panel.

In one embodiment, the panel member is a touch panel, where the touch panel is unattached to the display panel, thereby being separately removable from the display assembly. In another embodiment, the touch panel includes a touch panel edge gasket disposed between the touch panel edge portion and the front bezel member, where the touch panel edge gasket provides a water-tight seal between the touch panel and the front bezel member. For example, the touch panel edge gasket is made of an elastomer with a durometer less than 45 A.

In another embodiment, the panel members include a touch panel and an EMI panel retained in the gap. A rear face of the EMI panel is retained against the rear bezel member, where the EMI panel is separately removable from the display assembly. In one embodiment, an EMI panel gasket is disposed between the EMI panel and the rear bezel member, where the EMI panel gasket provides a water-tight seal between the EMI panel and the rear bezel member and is made of an elastomer with a durometer of at least 45 A. In some embodiments, the EMI panel is disposed in direct contact with the touch panel.

In some embodiments, the glass face of the display panel is retained in direct contact with the rear bezel member. In other embodiments, a display panel gasket is disposed between the display panel and the rear bezel assembly, where the display panel gasket made of an elastomer with a durometer of at least 45 A. In yet other embodiments, the display panel gasket is electrically conductive.

In some embodiments, the display assembly is capable of passing a Grade A, Class 1 mechanical shock qualification test defined by MIL-S-901 D.

In another embodiment, the front and rear bezel members are made of a rigid material capable of transmitting mechanical shock waves through the display assembly, thereby preventing a mechanical shock wave from combining with mechanical shock wave energy stored within the front or rear bezel member. In one embodiment, for example, the front bezel member and the rear bezel member are each made of a metal having an overall thickness of at least 0.25 inch. In one embodiment, the first bezel part has an overall thickness of at least 0.3 or 0.35 inch. In another embodiment, the rear bezel member has an overall thickness of at least 0.45 inch. In one embodiment, the rear bezel member has an overall thickness of about 0.50 inch. In one embodiment, the metal is 6061-T6 aluminum.

In other embodiments, a bezel gasket is disposed between the front bezel member and the rear bezel member, where the bezel gasket has a closed-loop geometry and provides a water-tight seal when the front bezel member is assembled with the rear bezel member. In one embodiment, the bezel gasket is electrically conductive.

In some embodiments, the display assembly includes a first display bracket and a second display bracket adjustably secured to the rear face of the rear bezel member. The first and second display brackets are adjustable to removably retain the display panel against the rear face of the rear bezel member.

BRIEF DESCRIPTION OF THE DRAWINGS

FIG. 10 illustrates a bottom plan view of one embodiment of a display bracket of the present invention.

FIG. 11 illustrates a front elevation of the display bracket of FIG. 10.

FIG. 12 illustrates a bottom plan view of the display bracket of FIG. 10.

FIG. 13 illustrates a top plan view of a light tube mounting bar of the present invention showing a channel with an open end and a closed end.

FIG. 14 illustrates a front elevation of the light tube mounting bar of FIG. 13 showing openings through the lower portion.

FIG. 15 illustrates a side elevation of the light tube mounting bar of FIG. 13 showing an open end of a channel.

FIG. 16 illustrates a top plan view of a rear plate of the display assembly of FIG. 1.

FIG. 17 illustrates a side elevational view of the rear plate of FIG. 16 showing fastener standoffs.

DETAILED DESCRIPTION OF THE PREFERRED EMBODIMENT

Figure 1:
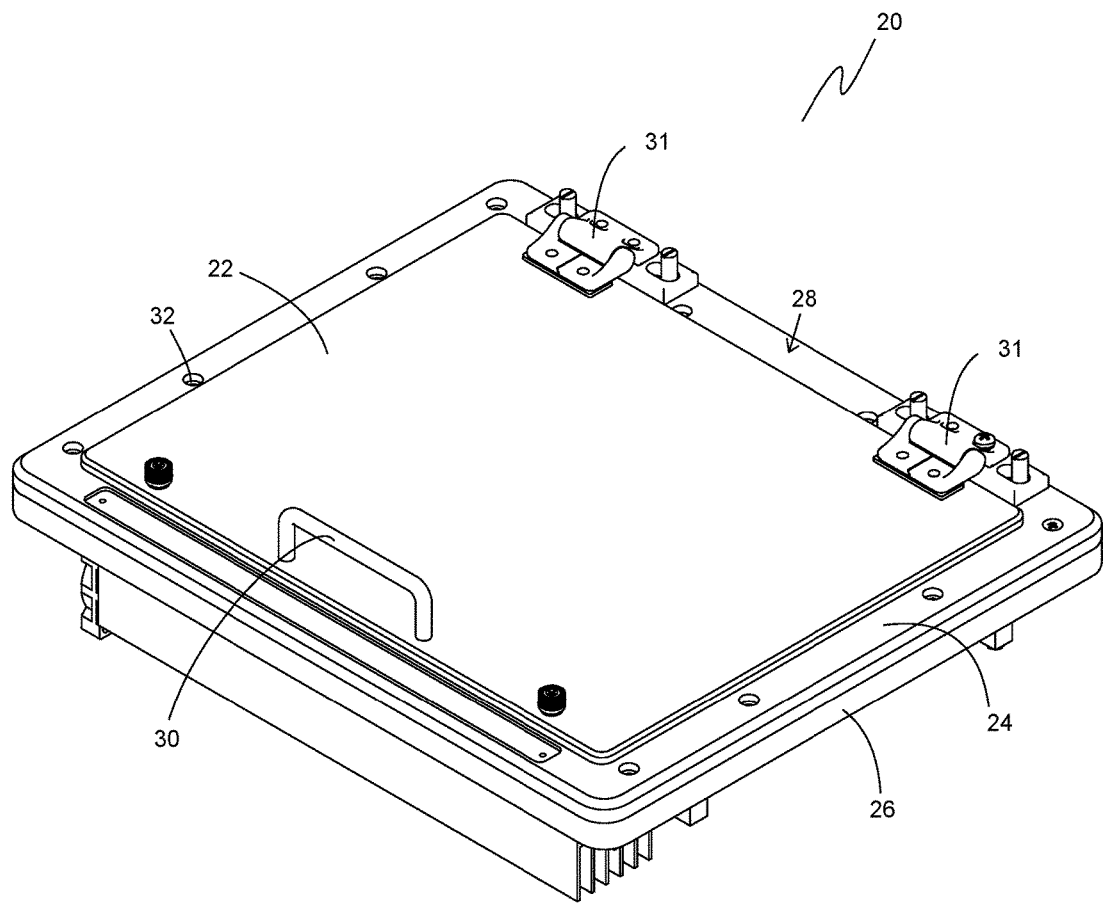
FIG. 1 illustrates a perspective view of one embodiment of a display assembly of the present invention with a cover in a closed position.

The preferred embodiments of the present invention are illustrated in FIGS. 1-20. FIG. 1 shows a perspective view of one embodiment of a display assembly 20 as used, for example, for a 12-inch touch control panel. Display assembly 20 has a split-bezel architecture with a front bezel member 24, a rear bezel member 26, and an optional front cover 22 attached to front bezel member 24. Front and rear bezel members 24, 26 generally have a rectangular shape and frame an open region or front display opening 88. Display assembly 20 is intended for use with LCD displays used in extreme service environments. Examples of extreme service environments include high levels of shock (e.g., from a nearby explosion), vibration (e.g., as used in transportation), water exposure, dust exposure, and electromagnetic interference (EMI). In one embodiment, front cover 22 is a rectangular aluminum plate with a thickness of about 0.2" that is operable between an open position and a closed position. In one embodiment, front cover 22 is hingedly attached by hinges 31 to a front face 28 of front bezel member 24. In one embodiment, front cover 22 is detachable from front bezel member 24. An optional handle 30 is fastened to front cover 22. As shown assembled in FIG. 1, front bezel member 24 is secured to rear bezel member 26 by fasteners 32 that extend through front bezel member 24 and engage rear bezel member 26. In some cases, fasteners 32 continue through rear bezel member 26 to engage and mount bezel assembly 20 to a cabinet, enclosure, work surface, wall, or other supporting structure.

Figure 2:
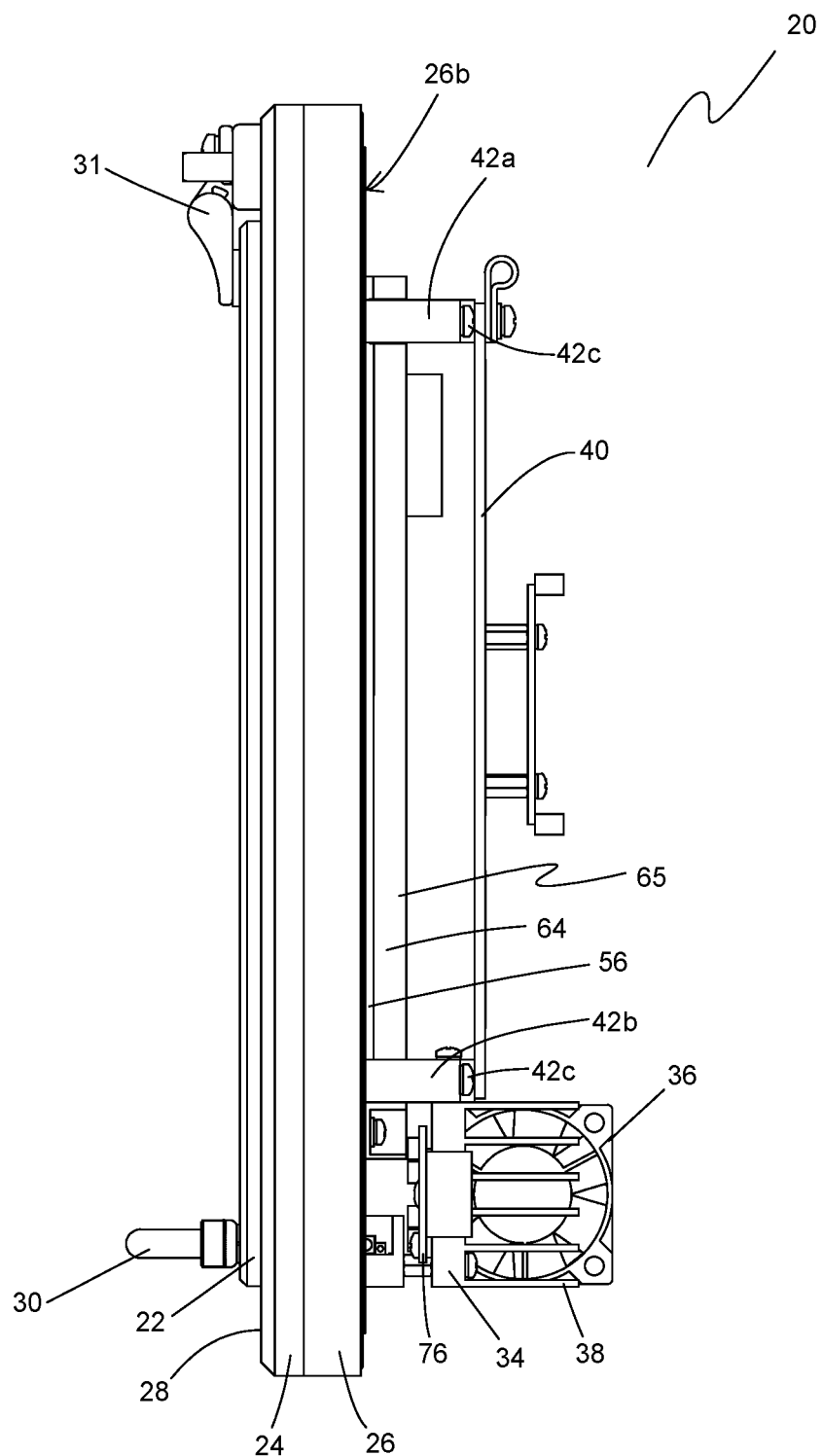
FIG. 2 illustrates a side view of the display assembly of FIG. 1 showing the split-bezel assembly and components attached thereto.

FIG. 2 illustrates a side view of display assembly 20 of FIG. 1. Front cover 22 with handle 30 is shown in the closed position against front face 28 of front bezel member 24. Front cover 22 preferably provides a water-tight and dust-tight seal between front cover 22 and front face 28 of front bezel member 24. An LCD display assembly 65 is retained against rear face 26*b* of rear bezel member 26. LCD display assembly 65 typically includes a light distribution panel 64 assembled as a single unit (e.g., by lamination) with a display panel 56 made of glass. LCD display assembly 65 is retained against rear face 26*b* of rear bezel member by display brackets 42*a*, 42*b*. A rear plate 40 is secured to display brackets 42*a*, 42*b* to provide protection to components of display assembly and rigidity to display assembly 20. Rear plate 40 also provides a place to mount drive components for LCD display assembly 65. In one embodiment, rear plate 40 is a rigid sheet of metal having a substantially planar, rectangular shape. Rear plate 40 in one embodiment is made of type 5052-H32 aluminum with a thickness of about 0.1" or other materials of equivalent rigidity.

In some embodiments, an optional heat sink 34 is connected to LED board 76 with a cooling fan 36 positioned to move air across fins 38 of heat sink 34. In other embodiments, heat sink 34 and cooling fan 36 are not necessary and are therefore omitted. LED board 76 in one embodiment is a circuit board that includes LEDs used for backlighting display assembly 20. Typically, a separate LED driver (not shown) is housed within a separate control panel (not shown) and coupled to LED board 76. LED driver delivers DC current to LEDs and/or CCFT as needed to provide the desired backlighting light intensity. In one embodiment, the LED driver supports four channels of DC current, one for each of red, green, blue, and yellow LEDs.

Figure 3:
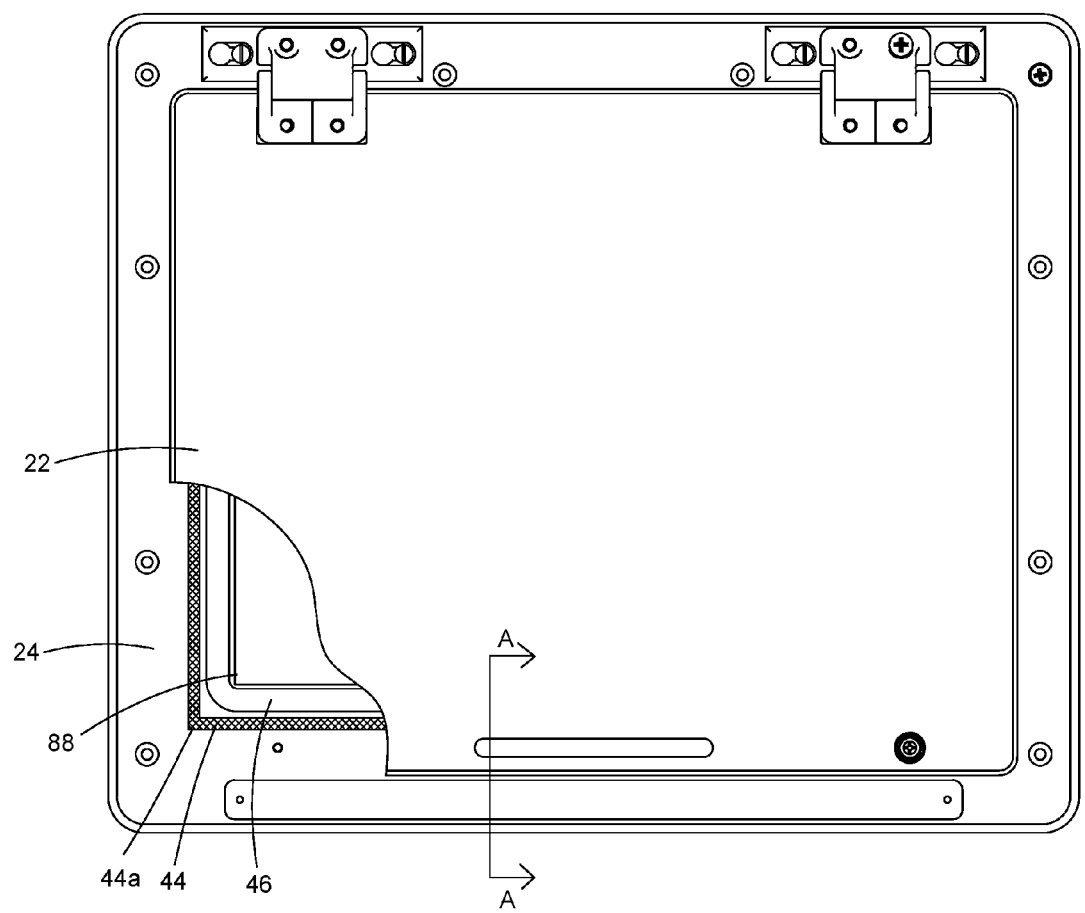
FIG. 3 illustrates a top plan view of the display assembly of FIG. 1 showing a partial cutaway to reveal the display screen and EMI panel.

FIG. 3 illustrates a top plan view of display assembly 20 with a lower left portion of front cover 22 cut away to reveal a cover gasket 44 in a cover gasket channel 44*a* between front bezel member 24 and front cover 22. In one embodiment, cover gasket 44 is an electromagnetic interference (EMI) gasket disposed in a cover gasket channel 44*a* located outside of a beveled inner face 46 of front bezel member 24, which extends radially outward from front display opening 88.

Figure 4:
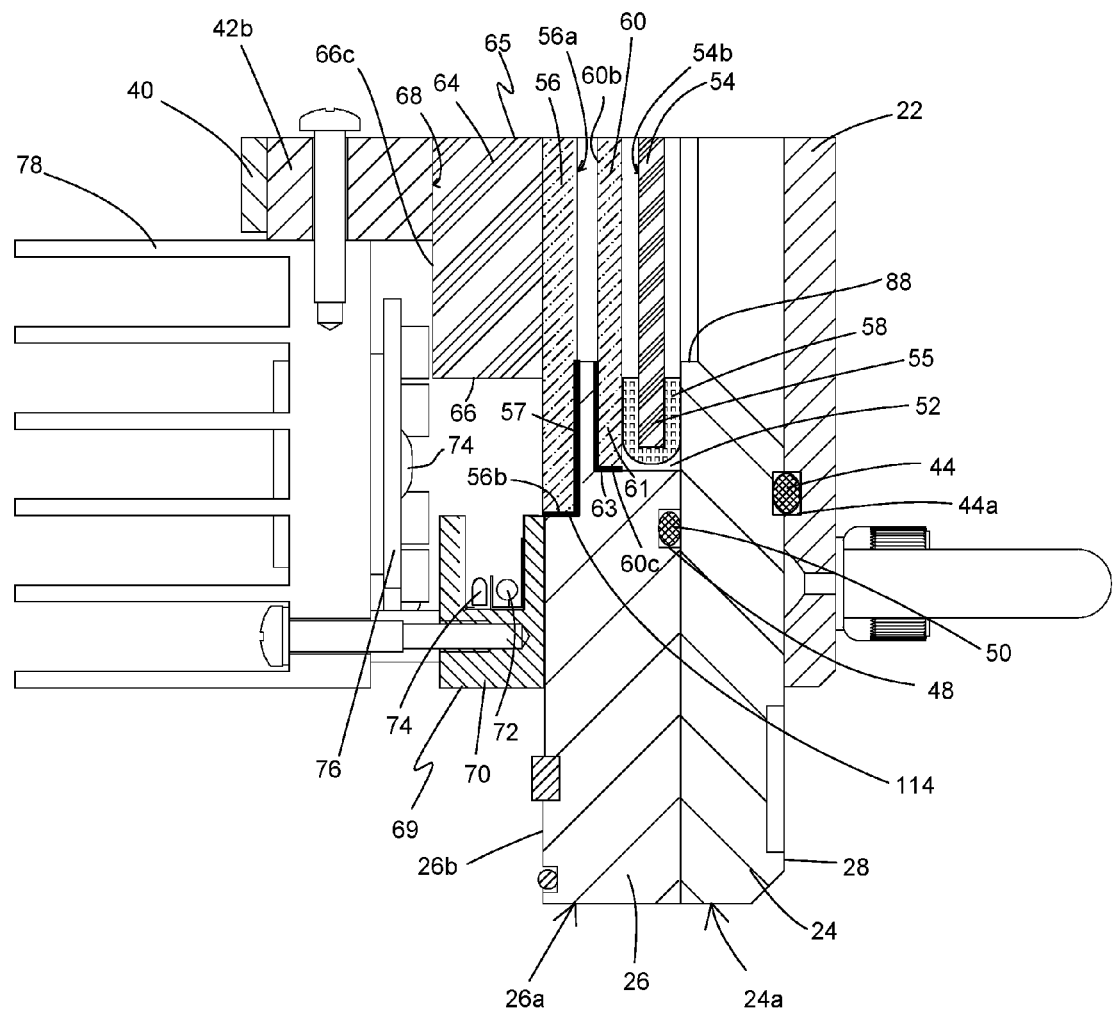
FIG. 4 illustrates a side cross sectional view of the split-bezel assembly along lines A-A of FIG. 3 showing components of the display assembly of FIG. 1

FIG. 4 illustrates a cross-sectional view through part of display assembly 20 as viewed along section line A-A shown in FIG. 3. Front cover 22 is closed against front bezel member 24 with cover gasket 44 disposed in cover gasket channel 44*a* in front cover 22 and/or front face 28 of front bezel member 24 to form a water-tight and dust-tight seal. In some embodiments, front cover 22 abuts front face 28 of front bezel member 24 when closed.

Similarly, a bezel gasket 50 is disposed between front bezel member 24 and rear bezel member 26 to form a water-tight seal between front bezel member 24 and rear bezel member 26 when these parts are fastened together in abutment or close proximity. In one embodiment, bezel gasket 50 is received in a bezel gasket channel 48 defined in front bezel member 24 and/or rear bezel member 26. The shape of bezel gasket channel 48 depends on the type of bezel gasket 50 used. Bezel gasket 50 in one embodiment is an electrically-conductive EMI shielding gasket, a waterproof gasket, an O-ring, a spacing gasket, an open cell or closed cell dust gasket, or the like. Bezel gasket 50 is preferably made of polymers (e.g., EPDM, silicone, rubber, or Viton®), but may also be made of metals, or other acceptable materials known in the art. In one embodiment, bezel gasket channel 48 has a rectangular cross-sectional shape and bezel gasket 50 is a ³⁄₃₂" diameter EPDM O-ring.

When assembled together, at least one pocket or gap 52 is defined between front bezel member 24 and rear bezel member 26 that is sized to receive an EMI panel edge portion 61 and/or a touch panel edge portion 55. In one embodiment, touch panel 54 is a separate component from display panel 56 and is disposed in gap 52 between front bezel member 24 and EMI panel 60. As such, a touch panel edge portion 55 is received in gap 52 with EMI panel edge portion 61. In one embodiment, a rear face 54*b* of touch panel 54 directly abuts EMI panel 60 and has touch panel edge gasket 58 disposed only between touch panel edge portion 55 and front bezel member 24.

In one embodiment, touch panel edge portion 55 includes a touch panel gasket 58. Touch panel edge gasket 58 in one embodiment is a rubber channel gasket or edge trim with a closed geometry and that extends continuously along all four edges touch panel 54. In one embodiment touch panel edge gasket 58 is a U-channel gasket that wraps around touch panel edge portion 55 and encapsulates touch panel edge portion 55. In other embodiments, touch panel edge gasket 58 has an I-shape or an L-shape. Touch panel 54 is typically an assembly of glass and polycarbonate, where rear face 54*b* is glass and front face 54*a* is polycarbonate. Touch panel 54 has a surface sensitive to touch and functions as the operator interface control for display assembly 20. Thus, in some embodiments, touch panel edge gasket 58 is made of neoprene rubber, foam, or other elastomeric materials that permit expansion of touch panel 54 due to heat and/or humidity while also providing a water-tight and dust-tight seal with front bezel member 24. In one embodiment, touch panel edge gasket 58 is made of rubber with a durometer below 45 A, such as 20 A-30 A or 30 A to 40 A. Having a lower weight component compared to display LCD display assembly 65, and to allow for expansion of touch panel 54, touch panel 54 is preferably mounted using an edge gasket 58 that is softer than display panel gasket 57 (if present). In one embodiment, edge gasket 58 is made of rubber and has a thickness about equal to the thickness of the glass in touch panel 54.

EMI panel 60 shields display assembly 20 from electromagnetic interference. In some embodiments, EMI panel 60 is made of polycarbonate and has an embedded copper mesh with a specified light loss rating, typically from 15 dB to 80 dB. Higher dB light loss ratings exclude more light and more EMI emissions. In one embodiment, EMI panel 60 has 0.001" copper mesh with 80 openings per inch and oriented at 45° to rectangular front bezel member 24. In other embodiments, EMI panel 60 has a glass substrate and is hard mounted with back side 60*b* of EMI panel (glass) in direct contact with rear bezel member 26 to prevent breakage due to mechanical shock waves. Hard mounting EMI panel 60 against rear bezel member 26 results in EMI panel 60 and rear bezel member 26 moving together when subjected to mechanical shock waves and vibration. Thus, by preventing EMI panel 60 and rear bezel member 26 from moving in opposite directions, this mounting technique allows EMI panel 60 to successfully pass shock qualification tests as discussed below.

In some embodiments, front bezel member 24 and rear bezel member 26 define a plurality of gaps 52 to receive various layers or components in display assembly 20. These component layers include, for example, LCD display assembly 65, EMI panel 60, and touch panel 54. Gaps 52 may be defined by recesses formed in front and/or rear bezel members 24, 26, or by tabs or protrusions extending from one or both of front bezel member 24 and/or rear bezel member 26. The number of gaps 52 is limited by the number of components and the combined thickness of the top and rear bezel members 24, 26.

LCD display assembly 65 is retained against rear bezel member 26 by display brackets 42a, 42b. In some embodiments, front display surface 56a of display panel 56 (usually glass) is hard mounted in direct contact with rear face 26b of rear bezel member 26 with no intervening structure between display panel 56 and rear face 26b. For example, glass of display panel 56 directly abuts rear bezel member 26 without any gasket in between. In other embodiments, a display panel gasket 57 is disposed between front display surface 56a and rear face 26b of rear bezel member 26, where display panel gasket 57 is made of an elastomer, such as rubber with a durometer of 45 A-75 A. In some embodiments, display panel gasket 57 has an I-shape or L-shape. With an L-shape, display panel gasket 57 is disposed between front display surface 56a and rear surface 26b of rear bezel member as well as between perimeter edge 56b and rear recess 114 of rear bezel member 26. Hard mounting display panel 56 against rear bezel member 26, whether with or without display panel gasket 57, reduces transmission of shock waves that cause glass components to break. Therefore, display panel 56 successfully passes shock qualification tests as discussed below LCD display assembly 65 includes light guide or light distribution panel 64. Light distribution panel 64 has an edge 66 positioned to receive light from a backlighting assembly 69. LCD display assembly 65 is held in position against rear bezel member 26 by display brackets 42. For example, display bracket 42b is fastened directly to rear bezel member 26 by fastener 42c (shown in FIG. 2) extending through display bracket 42b into rear bezel member 26. In one embodiment, backlighting assembly 69 includes a light source mounting bar 70 fastened to the back side 26b of rear bezel member 26. Light source mounting bar 70 includes a cold cathode fluorescent tube (CCFT) 72 and/or LEDs 74 as needed for backlighting. Light distribution panel 64 has a light reflector 68 along back face 66c to illuminate light distribution panel 64 with light from cold cathode fluorescent tube (CCFT) 72 and/or from LEDs 74.

As described above and shown in FIG. 4, space between individual components may be filled by a gasket, such as touch panel edge gasket 58 on touch panel 54. In other instances, no gasket exists between components of display assembly 20 and front or rear bezel members 24, 26. That is, some components, such as EMI panel 60, touch panel 54, and LCD display 65 are hard mounted to front or rear bezel member 24, 26. In some embodiments, hard mounting is accomplished by direct contact between the panel and the bezel member.

As applied to a panel, "hard mounted" means the panel is retained against a support structure without an intervening vibration isolator. Touch panel 54, LCD display 65, or EMI panel 60 are hard mounted when retained against front bezel member 24 and/or rear bezel member 26 by being mounted either in direct contact or by being mounted with a gasket that is not a vibration isolator. Being hard mounted enables bezel assembly 20 to meet shock qualification standards by transmitting mechanical shock waves through the component, rather than storing and retransmitting shock waves with an additive force as occurs with vibration isolators.

Hard mounting contrasts the use of dampening materials that "absorb" shock waves and tend to transmit the temporarily absorbed first shock waves slightly later where they combine with secondary or reflected shock waves stored in the material to produce a larger effective shock wave. In some cases the dampening materials allow the panel to make contact with the support structure or bezel when moving in opposite directions, therefore resulting in a collision between the panel and the support structure that breaks the panel. The larger effective shock wave can cause damage to components of display assembly 20. Using an elastomeric gasket made of hard rubber or eliminating a gasket altogether in some instances causes shock forces to be transmitted through component parts and results in a greater ability to successfully sustain high levels of shock without damage. Preferably, display assembly 20 passes Class 1 Grade A shock testing as defined in Military Specification MIL-S-901 D (1989) incorporated herein by reference in its entirety.

Military specification MIL-S-901 D details shock testing requirements for shipboard components, including classifications for shock grades, equipment classes, and shock test types. Grade A items are essential to the safety and continued combat capability of the ship. The unit must survive shock testing fully intact and functional. Grade B items are those whose operation is not essential to the safety and combat capability of the ship, but could become a hazard to ship operations as a result of exposure to mechanical shock. The unit is allowed to malfunction as a result of shock, but must remain fully intact due to the possibility of debris causing harm to personnel or other equipment.

Class I equipment is required to meet shock requirements without the use of resilient mountings installed between the equipment and the ship structure or foundation. Class II equipment meets shock requirements with the use of resilient mountings. Class III equipment may be mounted on a ship with or without the use of resilient mountings installed between the item and the ship structure, therefore required to meet both class I and class II requirements.

Mechanical shock testing may be conducted according to a lightweight test, a medium weight test, or a heavyweight test. In Grade A tests, the equipment tested must survive three blows in each of the X-axis, Y-axis, and Z-axis directions.

Figure 5:
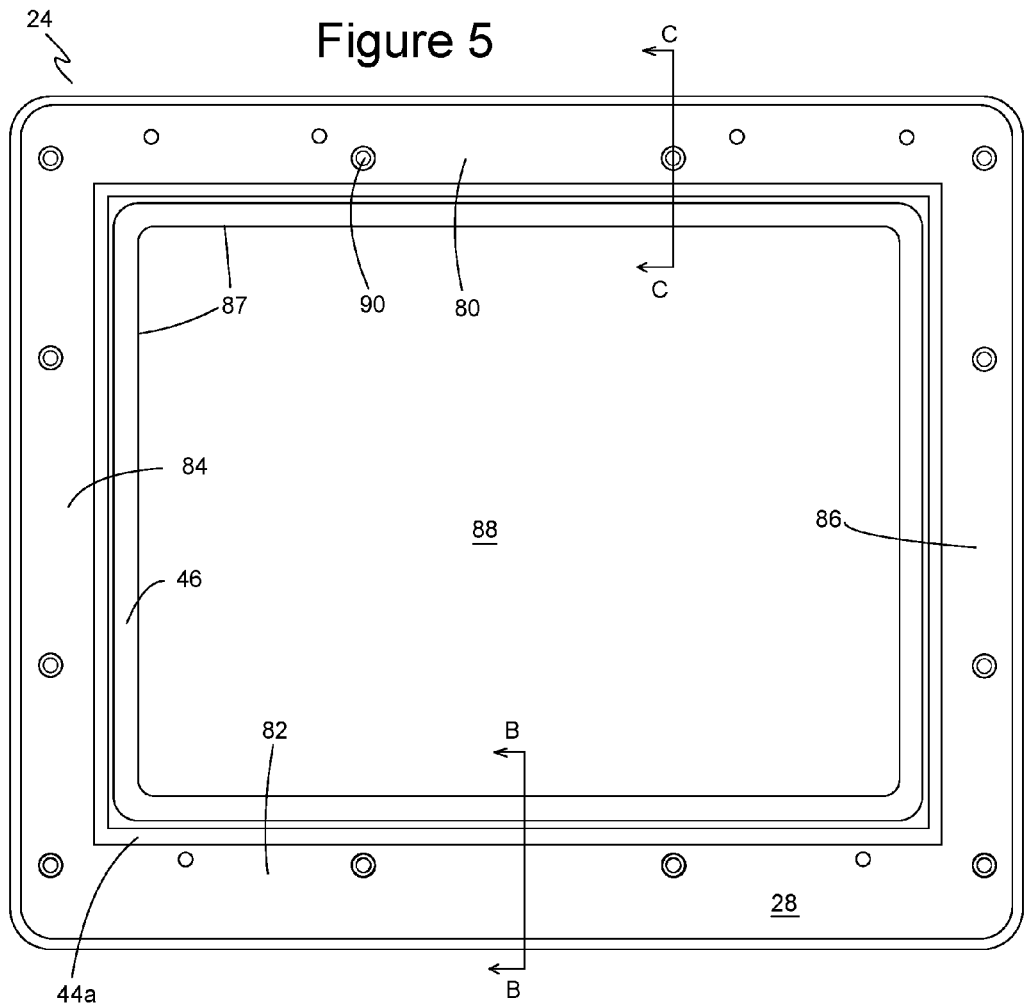
FIG. 5 illustrates a top plan view of one embodiment of a front bezel member of the present invention.

Referring now to FIG. 5, a front view illustrates one embodiment of front bezel member 24 as shown looking at front face 28. Front bezel member 24 is generally a rectangular frame with a front upper frame member 80, a front bottom frame member 82, a front left side member 84, and a front right side member 86 that together frame a front display opening 88 through which display panel 56 can be viewed and touch panel 54 touched. An inner edge portion 46 is optionally beveled along an inside perimeter edge 87 of frame members 80, 82, 84, 86. Inner edge portion 46 is preferably beveled at about 45 degrees to front face 28. Front bezel member 24 has a plurality of fastener openings 90 (preferably recessed) for attachment to rear bezel member 26 using machine screws or other appropriate fastener. In one embodiment, front face 28 of front bezel member 24 defines a cover-gasket channel 44a extending in a ring along inner edge portion 46 and sized to receive a cover gasket 44 for the purpose of forming a water-tight and/or dust-tight seal with front cover 22. Cover gasket 44 may also provide EMI shielding.

Figure 6:
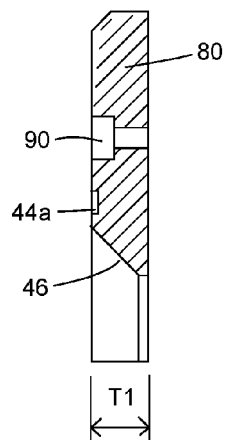
FIG. 6 illustrates a cross-sectional view of the lower member of the front bezel member of FIG. 5 taken along lines B-B of FIG. 5.
Figure 7:
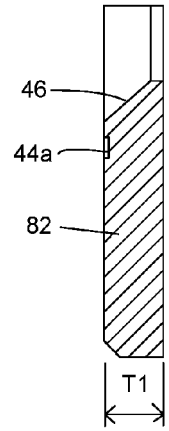
FIG. 7 illustrates a cross-sectional view of the upper member of the front bezel member of FIG. 5 taken along lines C-C of FIG. 5.

FIGS. 6 and 7 show cross-sectional views of front upper frame member 80 and front lower frame member 82 taken along section lines C-C and B-B, respectively, of FIG. 5. In one embodiment, front bezel member 24 is made of 6061-T6 aluminum that has an overall thickness T1 of about 0.4 inch. 6061-T6 Aluminum has a modulus of elasticity of 68.9 GPa, a shear strength of 207 MPa, a tensile yield strength of 276 MPa, and a hardness of 60 on a Rockwell B scale. This material and thickness of front bezel member 24 was determined empirically to be sufficiently rigid to transmit mechanical shock waves and to sufficiently reduce or prevent twisting of front bezel member 24 for success in shock qualification testing for a 12-inch display under Military Specification MIL-S-901 D. Other materials and thicknesses are acceptable provided that front bezel member 24 sufficiently transmits mechanical shock waves rather than storing and retransmitting the energy of mechanical shock waves, which can break glass in a LCD display panel 56. Each of front upper frame member 80 and front lower frame member 82 show beveled inner edge portion 46 and cover-gasket channel 44a. Front upper frame member 80 also shows fastener opening 90, which may be a smooth or threaded bore with recess.

Figure 8:
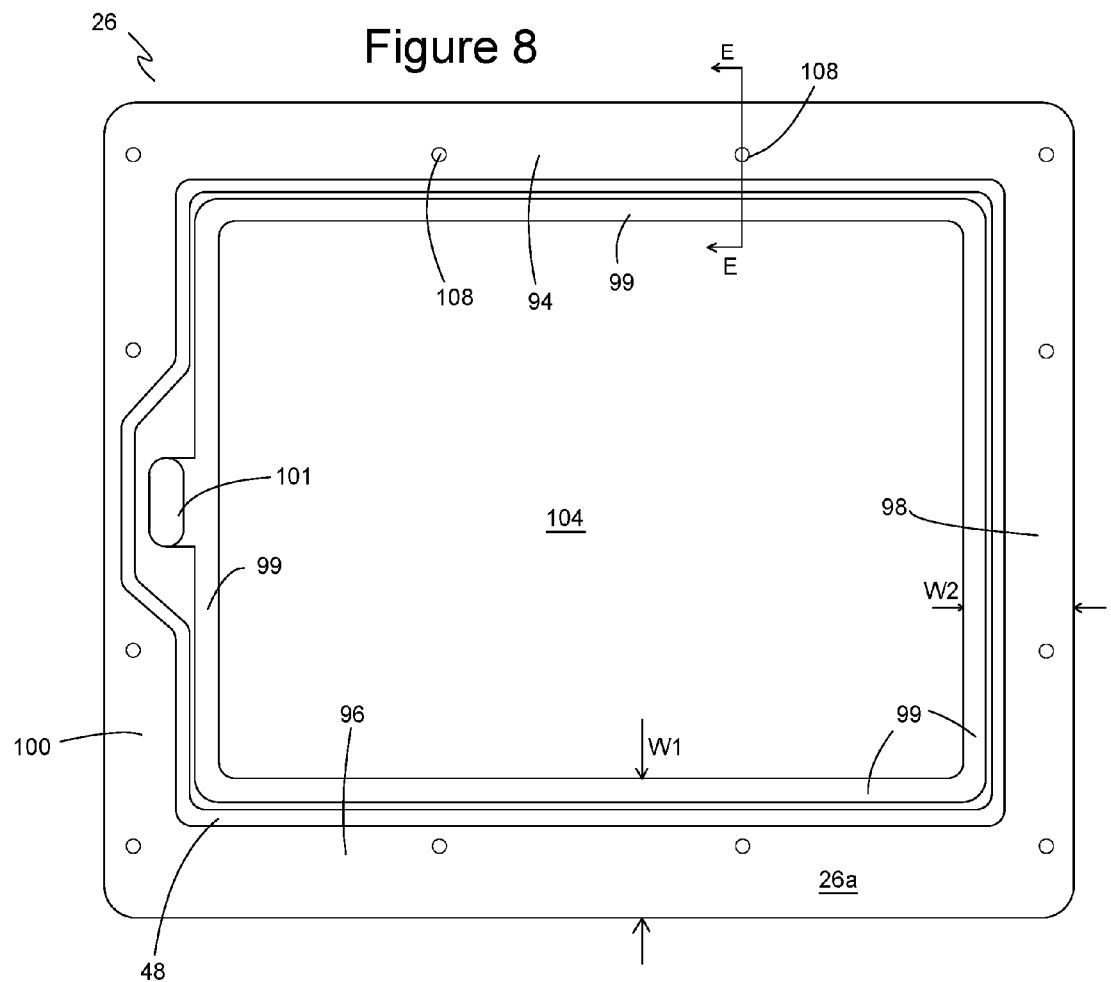
FIG. 8 illustrates a top plan view of one embodiment of a rear bezel member of the present invention.

FIG. 8 illustrates a front plan view of one embodiment of rear bezel member 26 as shown looking at front face 26a. Similar to front bezel member 24, rear bezel member 26 is generally a rectangular frame with a rear upper frame member 94, a rear lower frame member 96, a rear left-side frame member 98, and a rear right-side frame member 100. Rear frame members 94, 96, 98, 100 of rear bezel member 26 substantially align with front frame members 80, 82, 84, 86, respectively, of front bezel member 24. An inside edge recess 99 along each of rear frame members 94, 96, 98, 100, defines gap 52 with front bezel member 24 and is sized to receive EMI panel edge portion 61 and/or touch panel edge portion 53 (shown in FIG. 4). Rear frame members 94, 96, 98, 100 frame open area or rear display opening 104 for viewing display panel 56. In one embodiment, rear display opening 104 and front display opening 88 of front bezel member have the same size and align when bezel assembly 20 is assembled.

An optional connector opening 101 through rear left-side frame member 98 is sized and arranged for an electrical connector 102 (shown in FIG. 20) of touch panel 54. In one embodiment, rear bezel member 26 is made of type 6061 aluminum with an overall thickness T2 of 0.50 inch, where inside edge recess 66 has a depth from front face 26a of about 0.3 inch into rear bezel member 26. In one embodiment designed for a 12" display panel 56, rear upper and lower frame members 94, 96 have a width W1 of about 2 inches with inside edge recess 66 occupying about 0.40 inch of width W1; rear left-side and right-side members 98, 100 have a width W2 of about 1.65 inches with edge portion 66 also occupying about 0.40 inch of width W2.

Figure 9:
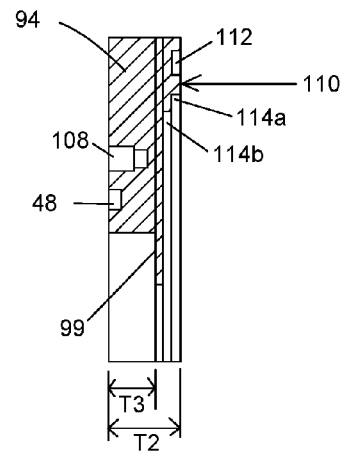
FIG. 9 illustrates a cross-sectional view of an upper member of the rear bezel member of FIG. 8 taken along line E-E of FIG. 8.

FIG. 9 illustrates a cross-sectional view of rear upper frame member 94 taken along section lines E-E shown in FIG. 8. As shown, for example, with rear upper frame member 94, bezel gasket channel 48 extends along each of rear frame members 94, 96, 98, 100 in a ring to receive bezel gasket 50 (shown in FIG. 4). A plurality of fastener recesses or openings 108 (preferably threaded) align with fastener openings 90 of front bezel member 24 and are sized to receive fasteners 32 (shown in FIG. 1). In some embodiments, at least some of fastener recesses 108 are blind, threaded bores that receive a threaded machine screw. A rear surface 26b of rear bezel member 26 optionally defines a rear gasket channel 112 to receive an additional gasket (not shown) for water-tight mounting to a wall or cabinet. Rear surface 26b of rear bezel member 26 also defines one or more rear recess 114, such as rear recesses 114a, 114b to receive LCD display assembly 65.

Referring now to FIGS. 10, 11, and 12, top, front, and bottom views, respectively, illustrate one embodiment of display bracket 42. Display bracket 42 has a straight, elongated middle portion 116 connected between an offset first end portion 118 and an offset second end portion 120 that each extend substantially perpendicularly from middle portion 116. First and second end portions 118, 120 preferably define a shoulder 126, 128 with a shoulder top surface 126a, 128a below a top surface 116a of middle portion 116. Shoulders 126, 128 allow heads of fasteners 42c (shown in FIG. 2) extending through openings 119 to rest flush with or below top surface 116a of middle portion 116. When assembled, middle portion 116 of each display bracket 42 secures LCD display assembly 65 to rear bezel member 26 with light distribution panel 64 and display panel 56 received between end portions 118, 120. Display bracket 42 in one embodiment is made of aluminum, steel, or other rigid material.

Middle portion 116 has a plurality of openings 122 extending therethrough in a direction parallel to end portions 118, 120 for attachment of additional components, such as rear panel 40. Each of first end portion 118 and second end portion 120 has one (or more) openings 119 that extend therethrough in a direction parallel to their direction of extension from middle portion 116. Openings 119 accept fasteners 42c (shown in FIG. 2) for attachment to rear bezel member 26. Middle portion 116 also has a plurality of openings 124 extending transversely therethrough in a direction perpendicular to openings 122 for attachment of components, such as heat sink 34.

Referring now to FIGS. 13-15, top, side, and end views, respectively, illustrate one embodiment of a light tube mounting bar 70 for a cold cathode fluorescent tube (CCFT) 72 or other light source, such as an array of LEDs 74 (shown in FIG. 4). A channel 130 extends along light tube mounting bar 70 and preferably has one open end 132 and one closed end 134. Thus, light tube mounting bar 70 is a longitudinal U-shaped bar (with one closed channel end 134) of generally rectangular overall cross-sectional shape. In one embodiment, channel 130 has a reflective surface 130a to reflect light from the light source.

A plurality of openings 138 extend transversely through a body portion 136 positioned beneath channel 130 of light tube mounting bar 70. Openings 138 accept fasteners for attachment of heat sink 34 as shown in FIG. 4. A plurality of additional openings 140 extend transversely at least partially through body portion 136 of light tube mounting bar 70. Additional openings 140 receive fasteners for attachment of additional components, such as LED board 76 as shown in FIG. 4.

Referring now to FIGS. 16 and 17, a plan view and a side cross-sectional view, respectively, illustrate one embodiment of cover 22. Cover 22 is a substantially planar, rectangular sheet of metal or other rigid material. In one embodiment, cover 22 is made of aluminum. One or more recessed through-openings 140 accept fasteners (not shown) for attachment of optional handle 30 (shown in FIG. 1). Additional through-openings 142 accept fasteners (not shown) for attachment of hinges 31 or other accessories (shown in FIG. 1).

Figure 18:
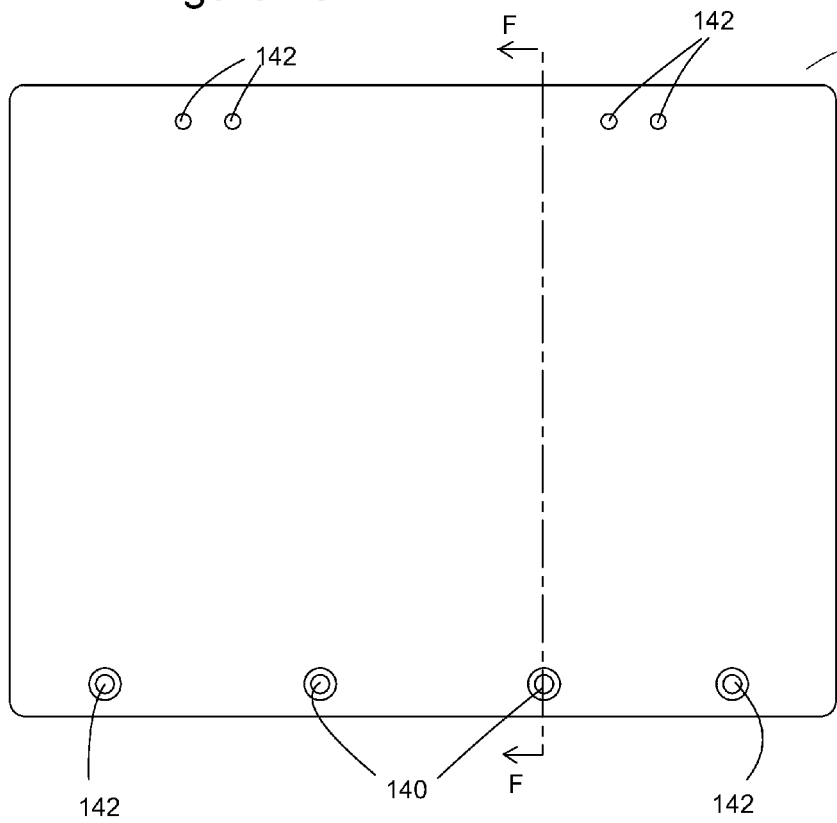
FIG. 18 illustrates a top plan view of a front cover of the present invention.
Figure 19:
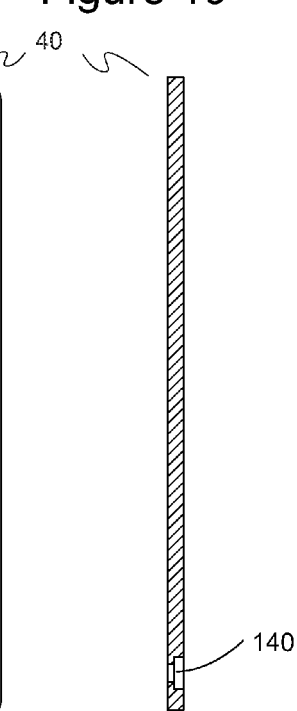
FIG. 19 illustrates a side cross-sectional view of the front cover of FIG. 18 taken along lines F-F of FIG. 18.

Referring now to FIGS. 18 and 19, a plan view and a side view, respectively, illustrate one embodiment of a rear plate 40. Rear plate 40 is a substantially planar sheet with a rectangular shape. In one embodiment, rear plate 40 is made of aluminum or other rigid material. Rear plate 40 has a plurality of through openings 144 and one or more additional accessory through openings 146. Through-openings 144 accept fasteners for attachment of rear plate 40 to display brackets 42a, 42b as shown in FIG. 2. Accessory through-openings 146 accept fasteners for attachment of a sub panel, cover, or other accessory (not shown). Rear plate 40 provides protection to components of display assembly 20 as well as structural support to display brackets 42 for maintaining display panel 56 in contact with rear bezel member 26.

Figure 20:
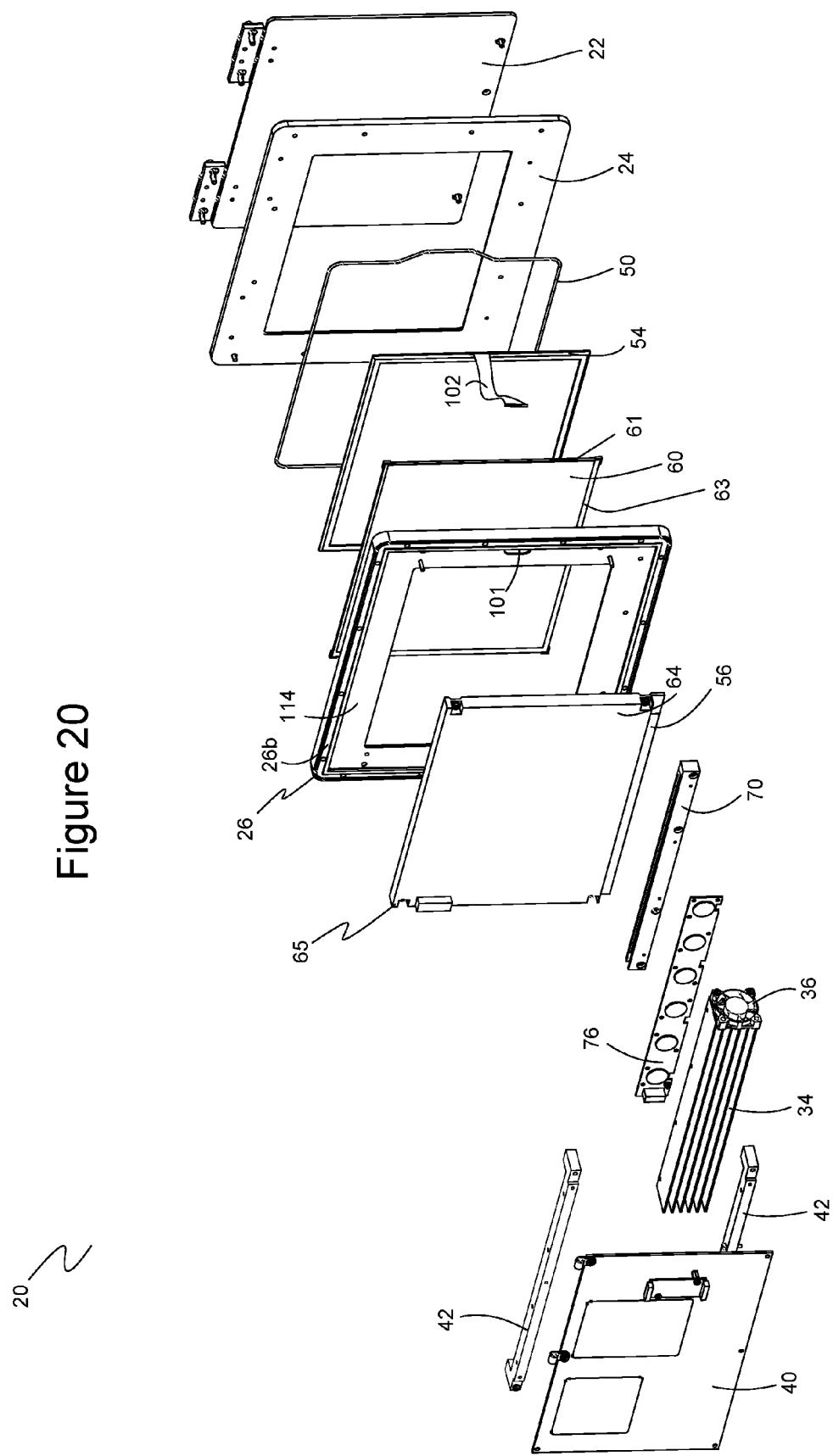
FIG. 20 illustrates an exploded perspective view of one embodiment of a display assembly of the present invention.

Referring now to FIG. 20, one embodiment of bezel assembly 20 is shown exploded in a rear, perspective view and includes rear panel 40, display brackets 42, LED board 76, light tube mounting bar 70, LCD display assembly 65 with light distribution panel 64 and display panel 56, rear bezel member 26, EMI panel 60, touch panel 54, bezel gasket 50, front bezel member 24, and cover 22.

In some embodiments of the assembled bezel assembly 20, the glass of display panel 56 is held in direct contact with rear bezel member 26 by display brackets 42. In other embodiments, an elastomeric gasket such as rubber ring with a durometer of 45 A-75 A is disposed between the glass surface of display panel 56 and rear face 26b of rear bezel member 26. In some embodiments, rear face 26a defines a display recess 114.

Touch panel 54 is shown with electrical connector 102, which may pass through connector opening 101 in rear bezel member 26. Bezel gasket 50 extends in a closed loop or ring outside of EMI panel 60 and touch panel 54. Bezel gasket 50 is compressed to some extent when front and rear bezel members 24, 26 are assembled, thereby providing a water-tight seal between front bezel member 24 and rear bezel member 26.

LED board 76 and light tube mounting bar 70 with a cold cathode fluorescent tube (CCFT) 71 provide backlighting to display panel 56 via light distribution panel 64. Light distribution panel 64 and display panel 56 are typically provided as a single, laminated LCD display assembly 65, where LCD display assembly 65 is mounted with glass of display panel 56 in direct contact with rear face 26b of rear bezel member 26 and held in firmly position by display brackets 42. Rear panel 40 attaches to display brackets 42 and optionally includes or receives a controller (not shown) to control display screen 56 and/or LED board 76 as well as receive user input from touch panel 54.

Assembling front bezel member 24 and rear bezel member 26 together with other individual components provides a virtual laminated product without the permanent bonding of an actual laminate process. Embodiments of bezel assembly 20 of the present invention allow display components to be individually removed and replaced. Such adaptability is useful when individual components need to be replaced due to damage or failure or when it is desirable to replace a component with one having different performance specifications.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

The invention claimed is:

1. A display assembly comprising:
   a front bezel member made of a rigid material and defining a first frame around a front display opening, the front bezel member having a front face and a rear face; and
   a rear bezel member made of a second rigid material and defining a second frame around a rear display opening, the rear bezel member having a front face and a rear face, wherein the rear bezel member is sized and constructed to be assembled with the front bezel member with the first frame aligned with the second frame and defining a gap between the first frame and the second frame; and
   a display panel having a glass face with a display edge portion removably retained against the rear face of the rear bezel member and extending across the rear display opening; and
   a panel edge portion of at least one panel member removably disposed in the gap between the first frame and the second frame with the at least one panel member extending across the front display opening, wherein the at least one panel member is selected from the group consisting of an EMI panel and a touch panel;
   wherein each of the display panel and the at least one panel member is individually removable from the display assembly.

2. The display assembly of claim 1, wherein the at least one panel member includes the touch panel and further comprises a touch panel edge gasket disposed between the touch panel edge portion and the front bezel member, wherein the touch panel edge gasket provides a water-tight seal between the touch panel and the front bezel member.

3. The display assembly of claim 2, wherein the at least one panel member also includes the EMI panel having an edge portion disposed in the gap between the front bezel member and the rear bezel member, wherein a rear face of the EMI panel is retained against the rear bezel member without any intervening vibration isolator, and wherein the EMI panel is separately removable from the display assembly.

4. The display assembly of claim 3 further comprising an EMI panel gasket disposed between the EMI panel and the rear bezel member, wherein the EMI panel gasket provides a water-tight seal between the EMI panel and the rear bezel member and is made of an elastomer with a durometer of at least 45 A.

5. The display assembly of claim 1, wherein the glass face of the display panel is retained in direct contact with the rear bezel member.

6. The display assembly of claim 1 further comprising: a first display bracket adjustably secured to the rear face of the rear bezel member; and a second display bracket adjustably secured to the rear face of the rear bezel member; wherein the first display bracket and the second display bracket retain the display panel against the rear face of the rear bezel member without an intervening vibration isolator.

7. The display assembly of claim 1 further comprising a display panel gasket disposed between the display panel and the rear bezel assembly, the display panel gasket made of an elastomer with a durometer of at least 45 A.

8. The display assembly of claim 7, wherein the display panel gasket is electrically conductive.

9. The display assembly of claim 1, further comprising: a light distribution panel fixedly attached to the display panel and having an edge portion disposed adjacent a light source, wherein the light source and the light distribution panel backlight the display panel.

10. The display assembly of claim 9, wherein the display assembly passes a Grade A, Class 1 mechanical shock qualification test defined by MIL-S-901D.

11. A display assembly comprising:

a front bezel member made of metal and defining a substantially rectangular first frame around a front display opening; and a rear bezel member made of metal and defining a second substantially rectangular second frame around a rear display opening, wherein the first frame is sized and constructed to be assembled in alignment with the second frame and define at least one gap between the first frame and the second frame; and an LCD display assembly with a glass display panel and a light distribution panel with an edge portion, the glass display panel being hard mounted against a rear surface of the rear bezel member; and a light source disposed adjacent the edge portion of the light distribution panel, wherein the light source and the light distribution panel backlight the LCD display assembly; wherein each of the glass display panel and the light distribution panel is individually removable from the display assembly.

12. The display assembly of claim 11 further comprising: a front cover hingedly attached to a front surface of the front bezel member and operable between a closed position and an open position.

13. The display assembly of claim 11, wherein the light source comprises a plurality of LEDs disposed along the edge portion of the light distribution panel with the plurality of LEDs positioned to emit light into the edge portion of the light distribution panel.

14. The display assembly of claim 11, wherein the front bezel member and the rear bezel member are made of 6061-T6 aluminum having a thickness of at least 0.25 inch.

15. The display assembly of claim 11, wherein the display assembly passes a Grade A, Class I shock qualification test defined by MIL-S-901 D.

16. The display assembly of claim 11, further comprising a bezel gasket disposed between the front bezel member and the rear bezel member, wherein the bezel gasket has a closed loop geometry and provides a water-tight seal when the front bezel member is assembled with the rear bezel member.

17. The display assembly of claim 16, wherein the bezel gasket is electrically conductive.

18. The display assembly of claim 11 further comprising a display panel gasket disposed between the glass display panel and the rear bezel assembly, the display panel gasket being an elastomer with a durometer of at least 45 A.

19. The display assembly of claim 18 further comprising: a first display bracket adjustably secured to the rear face of the rear bezel member; and a second display bracket adjustably secured to the rear face of the rear bezel member; wherein the first display bracket and the second display bracket are adjustable to removably retain the display panel against the rear face of the rear bezel member.

* * * * *